(12) United States Patent
Jeong

(10) Patent No.: US 6,275,438 B1
(45) Date of Patent: Aug. 14, 2001

(54) CIRCUIT FOR APPLYING POWER TO STATIC RANDOM ACCESS MEMORY CELL

(75) Inventor: Seong-Ik Jeong, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/525,908

(22) Filed: Mar. 15, 2000

(30) Foreign Application Priority Data

Mar. 29, 1999 (KR) .................................................. 99-10789

(51) Int. Cl.[7] .................................................... G11C 7/00
(52) U.S. Cl. ........................................ 365/226; 365/189.09
(58) Field of Search ........................ 365/189.09, 226; 327/541, 539; 323/314, 316

(56) References Cited

U.S. PATENT DOCUMENTS

| | | | |
|---|---|---|---|
| 4,349,778 | * 9/1982 | Davis | 323/314 |
| 5,408,435 | 4/1995 | McClure et al. | 365/201 |
| 5,552,740 | * 9/1996 | Casper | 327/541 |
| 5,768,207 | 6/1998 | Raad et al. | 365/226 |
| 5,834,927 | * 11/1998 | Sugawara | 323/314 |

* cited by examiner

Primary Examiner—David Nelms
Assistant Examiner—Gene N. Auduong
(74) Attorney, Agent, or Firm—Fleshner & Kim, LLP

(57) ABSTRACT

A power supply circuit for a static random access memory cell or the like is provided that reliably supplies a voltage different from an external power supply voltage. The power supply circuit can include a first transistor with a first electrode coupled to an external power source, and a second electrode coupled to a first node that supplies the voltage different from the external power supply voltage. First and second resistors are coupled in series between the first node and a ground voltage. A third resistor is coupled in series to the external power supply. A second transistor has a first electrode coupled to the third resistor at a second node, a second electrode coupled to the ground voltage, and a control electrode coupled to a third node, which is between the first and second resistors. A third transistor having a first electrode coupled to the external power supply source, a second electrode coupled to the gate of the first transistor at a fourth node, and a control electrode coupled to the second node; and a fourth resistor coupled in series between the fourth node and the ground voltage. The power supply circuit can further include a frequency compensation circuit coupled between the second and fourth nodes.

20 Claims, 4 Drawing Sheets

CIRCUIT FOR APPLYING POWER TO STATIC RANDOM ACCESS MEMORY CELL

BACKGROUND OF THE INVENTION

1. Field of the Invention

The present invention relates to a circuit for applying power to a semiconductor device, and in particular, to a power circuit for a static random access memory (SRAM) cell.

2. Background of the Related Art

A static random access memory cell (SRAM) includes a flip-flop having a pair of cross-coupled inverters. The SRAM logic state is determined by the voltage of output terminals of the inverters, such that one of the output terminals of the inverters is at a "LOW" state when the other output terminal is at a "HIGH" state. Because the SRAM maintains a constant, stable state, no periodical refresh operation is required to constantly retain stored information, in contrast to a dynamic random access memory cell (DRAM).

The SRAM carries out a more stable operation and consumes less power than the DRAM. In addition, the SRAM is the most rapidly operated semiconductor memory device due to the self-restoring function of the flip-flop. However, integration is low because at least six elements are needed for each SRAM. As a result, SRAMs having less than or equal to a 1 megabyte storage capacitor generally employ a poly load resistor cell. The benefits of the poly load resistor cell include simplicity and small size.

FIG. 1 shows a circuit diagram of a related art SRAM chip using a poly load resistor cell. The SRAM chip includes a plurality of memory cells 10 driven by a memory cell driving circuit block 20. A memory cell 10 includes first and second NMOS access transistors TA1, TA2, first and second NMOS drive transistors TD1, TD2, first and second resistors RL1, RL2, first and second nodes n1, n2, a bit line BL and a bit bar line /BL, a word line WL, and an external power supply Vcc.

Gates of the first and second access transistors TA1, TA2 are coupled to the word line WL. A first electrode of the first access transistor TA1 is coupled to the bit line BL, and its second electrode is commonly coupled to the first node n1 with the first resistor RL1, a gate of the second drive transistor TD2 and a first electrode of the first drive transistor TD1. Correspondingly, a first electrode of the second access transistor TA2 is coupled to the bit bar line /BL, and its second electrode is commonly coupled to the second node n2 with the second resistor RL2, the gate of the first drive transistor TD1 and a first electrode of the second drive resistor TD2.

The first and second resistors RL1, RL2 are coupled to the external power supply VCCext. The second electrodes of the first and second drive transistors TD2, TD2 are coupled to an external ground voltage VSSext.

The external power supply voltage VCCext applied to the SRAM is applied to the memory cell 10 and the memory cell driving circuit block 20 at an equal level. The power is supplied to the memory cell 10 via the poly resistors RL1, RL2 having a resistance on the order of $10^{12}\Omega$, after passing through relatively small metal wires of non-resistance. Since the SRAM cell 10 is configured in a latch form, the application of power to the memory cell 10 results in the nodes n1, n2 being set at opposite power levels. For example, the first node n1 is set at a "HIGH" level and the second node n2 is set at a "LOW" level when power is provided to one of the nodes n1, n2, thus maintaining a stable state.

When the word line WL is transited to the 'ON' state and the bit line BL is precharged (generally, a VCC level, a high-impedance state), the first node nil of the memory cell 10 transits to a "HIGH" level, relative to the "LOW" level of the second node n2. The "LOW" node n2 data is then transmitted to the bit line BL. The voltage level of the "HIGH" node nil is determined according to the ratio of the current of the drive transistors and access transistors.

When the word line WL is transited to the 'OFF' state, the first and second nodes n1, n2 maintain a stable value based on the relationship between the resistors RL1, RL2 and the drive transistors TD1, TD2. The first drive transistor TD1 is transited to the 'OFF' state, and the resistance at that drive transistor TD1 is greater than the resistance of the first resistor RL1. Accordingly, the second drive transistor TD2 is transited to the 'ON' state, and the resistance at that state is less than the resistance of the second resistor RL2. As a result, the standby current flows through the transistor TD2.

To reduce the standby current, the second resistor RL2 resistance must be increased. Correspondingly, the first resistor RL1 resistance must be decreased to retain the memory cell 10 data. However, the second resistor RL2 resistance must be smaller, and the first resistor RL1 resistance must be greater when opposite data is employed.

Thus, standby current cannot be reduced simultaneously with cell data retention. The memory cell 10 resistance must be increased to reduce the standby current, but that increase deteriorates the voltage necessary to maintain a data retention state, which is generally less than 1.5V.

When sufficient power is supplied to retain the data, the resistance of the second drive transistor TD2 increases more sharply than at the normal operational state. Because the manual resistor RL2 maintains a relatively constant value, the voltage level of the "LOW" node n2 increases.

Accordingly, when the voltage of the "LOW" node n2 increases, the 'OFF' resistance value of the first drive transistor TD1 decreases, and thus decreases the voltage of the "HIGH" node n1. The decreased voltage of the "HIGH" node n1 causes a feedback effect, increasing the voltage of the "LOW" node n2.

If the resistance value is increased to prevent the above-described phenomenon, the data retention voltage is deteriorated. Thus, it is impossible to simultaneously increase the resistance value and satisfy the data retention voltage.

In the related art SRAM cell, when a process change in standby mode reduces the resistance values of the load resistors, the standby current of the cell increases sharply. When the resistance value of the load resistor increases to reduce the standby current, a width or a thickness thereof must be reduced according to a property of the load resistor, which results in opening of the load resistors and low yield. When the resistance values of the load resistors are significantly high, the current flowing through the load resistors is reduced, thereby deteriorating the data retention voltage property.

According to another example of the related art, the voltage level of the internal node may be retained by using a cell external circuit, including a reference voltage generating block (not shown) generating a reference voltage in regard to an external signal. As a result, the chip size is increased, and a significant amount of power is consumed.

As described above, the related art has various disadvantages. In the related art, the current cannot be reduced during standby mode without deteriorating the voltage for retaining cell data. Maintaining that voltage increases the current in standby mode. Further, larger chips that consume more power are required to compensate for the disadvantages, resulting in reduced efficiency of size and speed.

The above references are incorporated by reference herein where appropriate for appropriate teachings of additional or alternative details, features and/or technical background.

SUMMARY OF THE INVENTION

An object of the present invention is to provide a circuit for supplying voltage to an SRAM cell that substantially obviates one or more of the problems caused by limitations and disadvantages of the related art.

Another object of the present invention is to provide a circuit for applying a voltage to a static random access memory (SRAM) cell that can supply a voltage different from a voltage level of an external power supply source to the cell by using an internal circuit.

To achieve at least these and other objects and advantages in whole or in part in accordance with the purpose of the present invention, as embodied and broadly described, the present invention includes a circuit for applying a power to a memory cell having a first PMOS transistor having its source coupled to an external power supply source, and having its drain coupled to a first node coupled to the memory cell; first and second resistors coupled in series between the first node and a ground voltage; a third resistor coupled between the external power supply source and a second node; an NMOS transistor having its drain coupled to the second node, having its source coupled to the ground voltage, and having its gate coupled to a third node between the first and second resistors; a second PMOS transistor having its source coupled to the external power supply source, having its drain coupled to a fourth node coupled to the gate of the first PMOS transistor, and having its gate coupled to the second node; and a fourth resistor coupled between the fourth node and the ground voltage.

To further achieve the above objects in whole or in parts, there is provided a circuit for applying power for use in a memory cell according to the present invention that includes first and second reference voltages and a power supply circuit coupled between first and second reference voltages to generate a third reference voltage for the memory block, wherein the power supply circuit includes a generation circuit that generates the third reference voltage, and a control circuit that controls the generation circuit to maintain the third reference voltage at a substantially constant level, and a memory cell block that receives the third reference voltage from the power supply circuit.

To still further achieve the above objects in whole or in parts, there is provided a semiconductor device according to the present invention that includes a memory cell, a memory cell driving circuit block, a power supply that supplies a first reference voltage, a circuit coupled to the memory cell and the power supply that applies a substantially constant second reference voltage to the memory cell, wherein the second reference voltage does not equal the first reference voltage.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
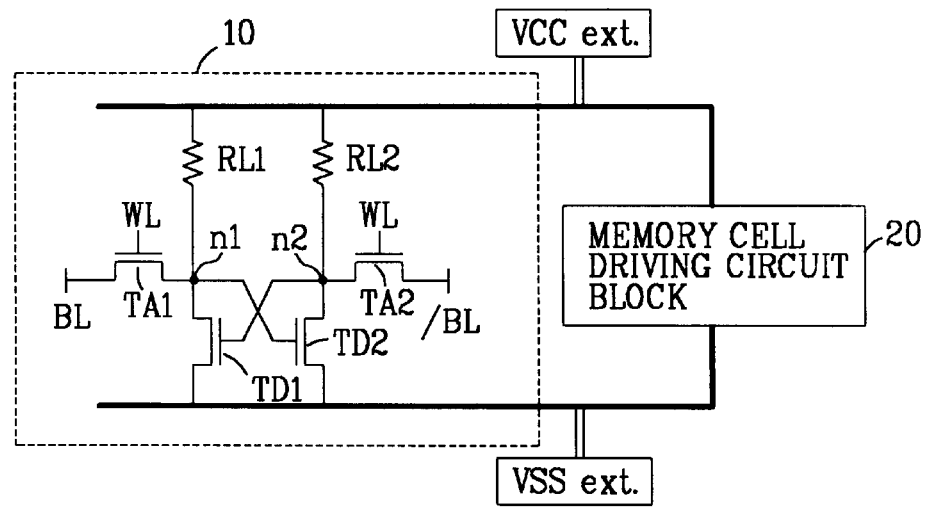
FIG. 1 illustrates a schematic diagram of a related art static random access memory chip.
Figure 2:
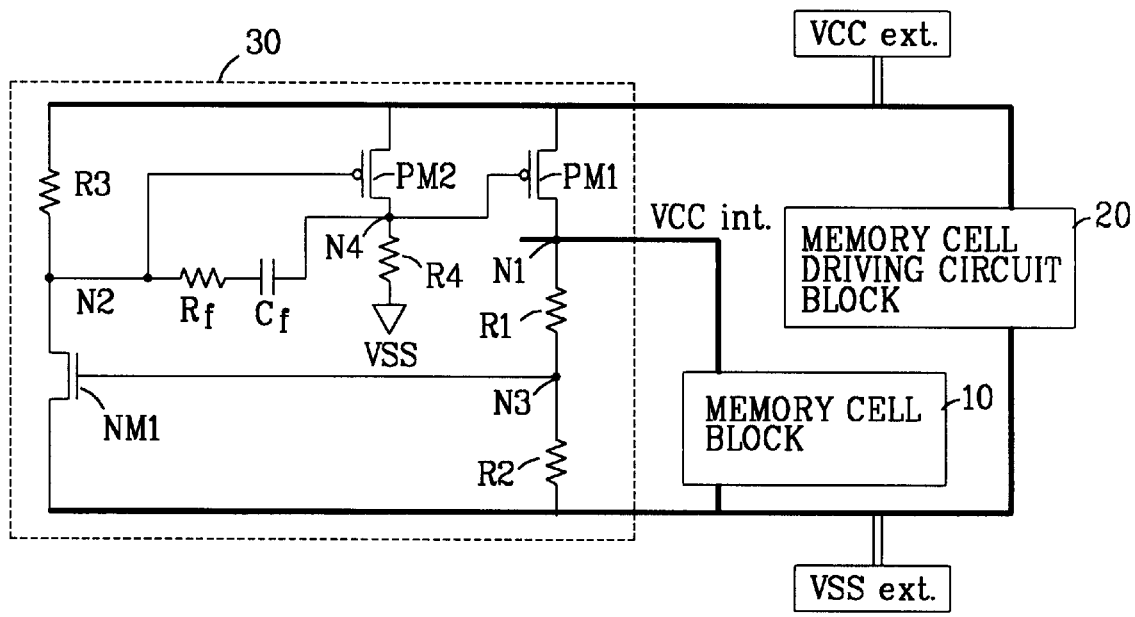
FIG. 2 illustrates a schematic diagram of a circuit for applying power to a cell in a static random access memory chip in accordance with a preferred embodiment of the present invention.

FIG. 2 is a schematic diagram that shows a static random access memory (SRAM) chip according to a first preferred embodiment of the present invention. The SRAM chip includes external voltage VCCext, VSSext, a memory cell block 10, a memory cell driving block 20, and a circuit for applying power 30. The circuit 30 for applying power applies power to cells in the memory cell block. 10 and includes first and second PMOS transistors PM1, PM2, first, second, third and fourth resistors R1, R2, R3, R4, a NMOS transistor NM1, an external power supply VCCext and an external ground VSSext. The circuit 30 also includes an internal cell voltage VCCint and a ground VSS. Alternative exemplary circuits for the first preferred embodiment further include a frequency compensation component. The frequency compensation component is preferably series coupled frequency compensation capacitor $C_f$ and resistor $R_f$.

The first PMOS transistor PM1 includes a source coupled to the external power supply source VCCext, a drain commonly coupled with the first resistor R1 and the memory cell block 10 at a first node N1, and a gate commonly coupled with a drain of the second PMOS transistor PM2 and the fourth resistor R4 at a fourth node N4. The second PMOS transistor PM2 includes a source coupled to the external power supply source VCCext, the drain commonly coupled to the fourth node N4, and a gate commonly coupled to a second node N2.

The NMOS transistor NM1 includes a source coupled to the external ground VSSext, a drain commonly coupled with the third resistor R3, and the gate of the second PMOS transistor PM2 at the fourth node N4, and a gate commonly coupled with the first resistor R1 and the second resistor R2 at a third node N3. The first and second resistors R1, R2 are coupled in series with respect to each other at the third node N3 between the first node N1 and the external ground voltage VSSext.

The frequency compensation resistor $R_f$ and the frequency compensation capacitor $C_f$ are preferably coupled to each other in series between the second and fourth node N2, N4. The memory cell block 10 and the memory cell circuit driving circuit block 20 operate in a manner consistent with the related art. Accordingly, a detailed description is omitted.

Figure 3A:
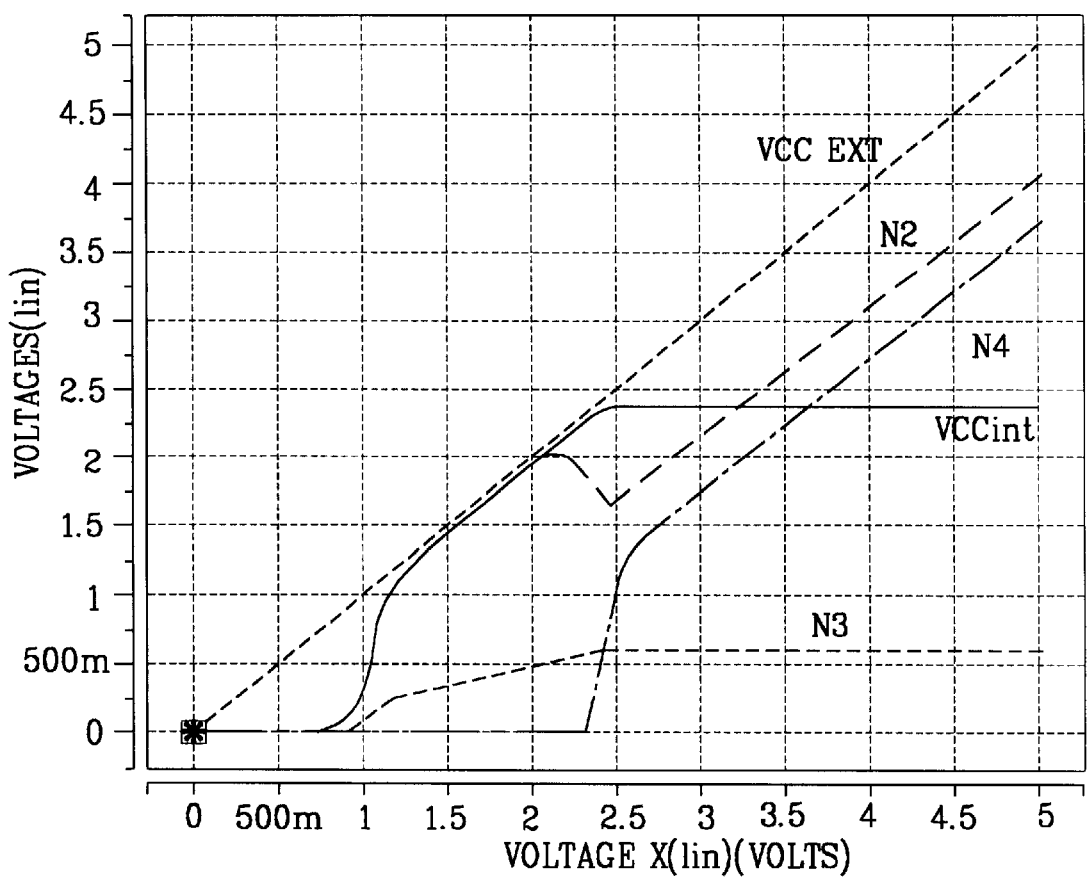
FIGS. 3A and 3B are graphs plotting the DC property in accordance with a preferred embodiment of the present invention.
Figure 3B:
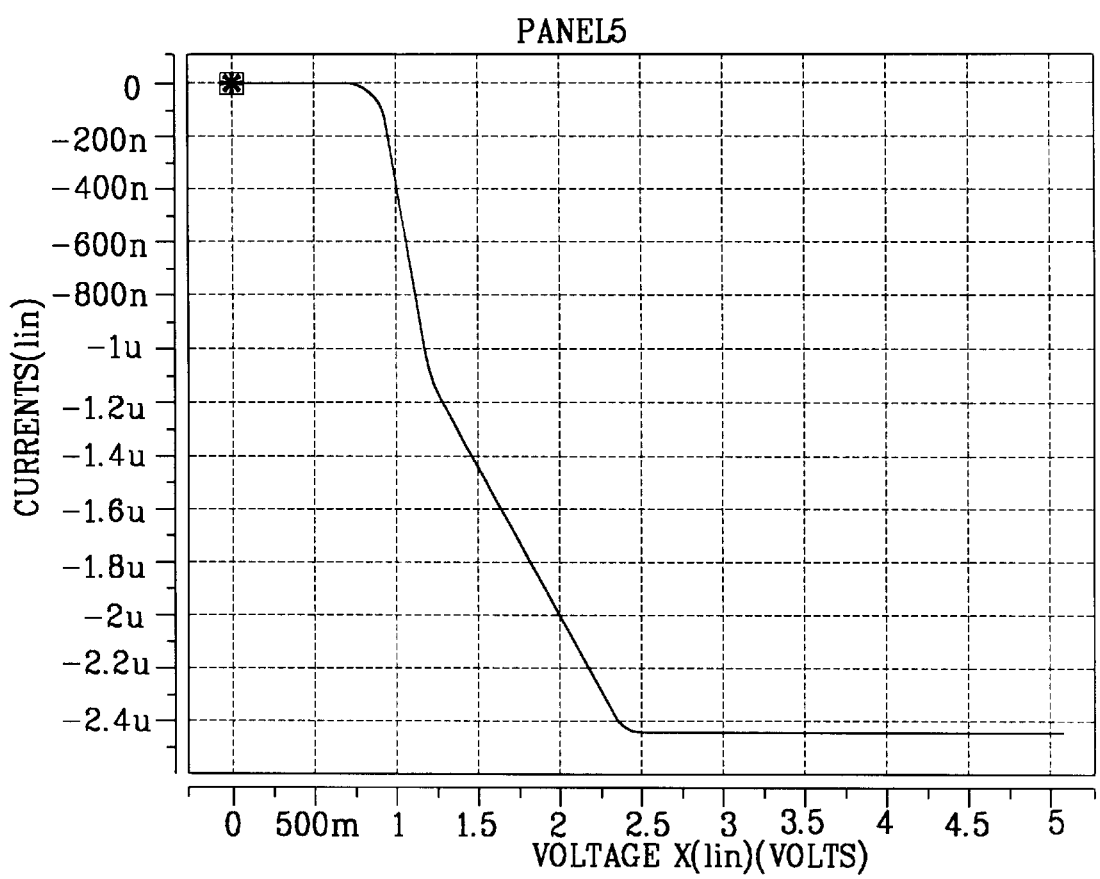

FIGS. 3A and 3B graphical illustrate voltage levels at each node in the circuit for applying the power to the cell 30 according to the first preferred embodiment of the present invention. When the power supply voltage VCCext is externally supplied, it is applied to the first node N1 through the first PMOS transistor PM1. As the power supply voltage gradually increases, the source voltage of the first PMOS transistor PM1 increases, and the voltage at the negative side of the gate is relatively increased. As a result, the charge supplied through the first PMOS transistor PM1 is increased, and a cell voltage VCCint of the first node N1 is increased.

The first node N1 is coupled to the memory cell block 10, and the cell voltage VCCint from the first node N1 is preferably the power supply voltage for the memory cell block 10. When the cell voltage VCCint reaches a predetermined level, the cell voltage VCCint is divided using a predetermined ratio according to the resistance ratio of the first and second resistors R1, R2. That predetermined voltage level is then applied to the third node N3, which is commonly coupled to the first and second resistors R1, R2.

The signal at the third node N3 is applied to the gate of the NMOS transistor NM1. When that signal exceeds the threshold voltage of the NMOS transistor NM1, the NMOS transistor NM1 transits to the 'ON' state. The drain of the NMOS transistor is commonly coupled to the third resistor R3 at the second node N2, and the power supply voltage VCCext becomes a short circuit with the ground voltage VSSext.

The second node N2 is connected to the gate of the second PMOS transistor PM2. When the voltage of the second node N2 is less than the predetermined level of the NMOS transistor NM1, the second PMOS transistor PM2 transits to the 'ON' state, thus increasing the voltage of the fourth node N4, which is coupled to the drain of the second PMOS transistor PM2. Therefore, the first PMOS transistor PMi with a gate connected to the fourth node N4 transits to the 'OFF' state. As a result, the voltage at the first node N1 is constantly maintained despite the increased power supply voltage VCCext. Since the transistors NM1, PM1, PM2 output an inverted signal with respect to the gate input signal, the VCCint signal causes a negative feed back effect for the voltage of the third node N3.

FIG. 3B graphically shows that while the external voltage increases, the standby current of the SRAM cell decreases significantly from the time the NMOS transistor NM1 is transited to the 'ON' position and maintains a remarkably low value while the cell voltage is held constant. The resistance values of the resistors R1, R2, R3, R4 control the current applied to the memory cell 10 at a predetermined value, for example, less than 1µ A.

The phase margin can also effect the negative feed back system. According to the first preferred embodiment of the present invention, the resistor Rf or the capacitor Cf for frequency compensation are coupled in series between the second node N2 and the fourth node N4, to prevent oscillation by the phase margin.

Figure 4A:
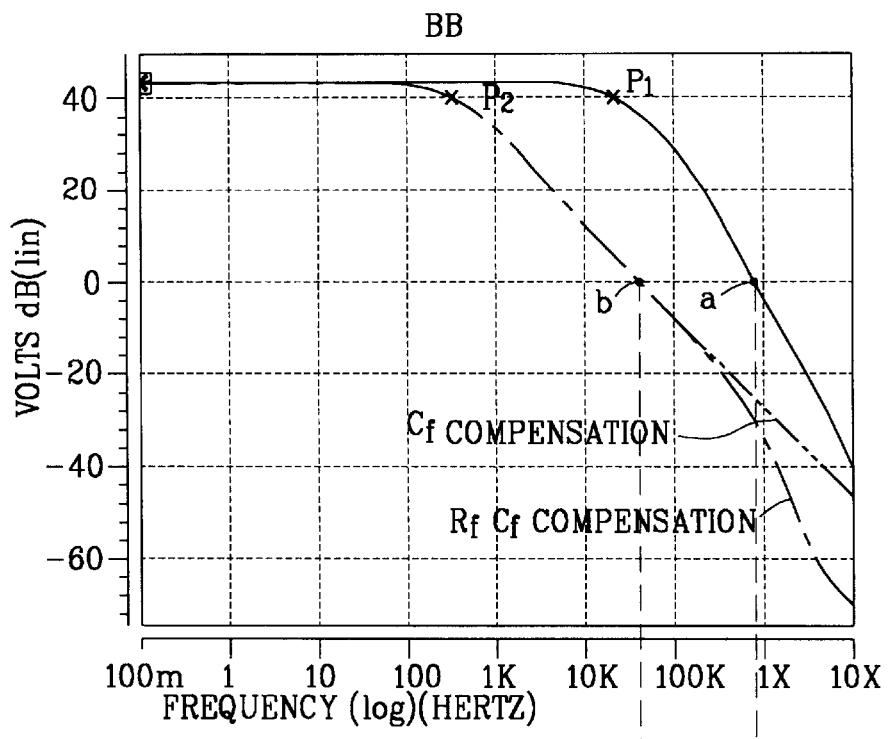
FIGS. 4A and 4B are graphs plotting the frequency compensation effects by Rf and Cf in accordance with a preferred embodiment of the present invention.
Figure 4B:
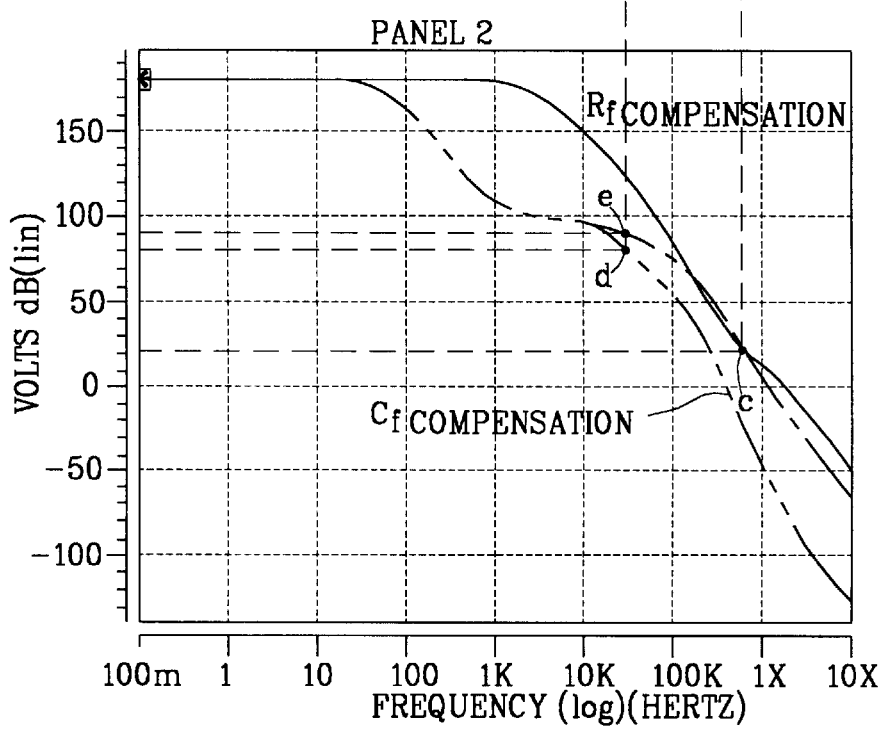

FIGS. 4A and 4B graphically plot the frequency of the first preferred embodiment of the present invention. A compensation circuit in the circuit 30 preferably includes only the capacitor $C_f$ or both the resistor Rf and the capacitor Cf. The dominant pole P2 with the compensation circuit moves to a lower frequency than the dominant pole P1 without the compensation circuit, thereby carrying out a stable circuit operation.

The circuit 30 is stable when the voltage phase is greater than 45°, as the voltage gain equals '0'. FIG. 4B shows that when the compensation circuit is not employed in the circuit 30, the voltage phase (c) is much less than 45° when the voltage gain equals '0' (a). When only the capacitor Cf or both the resistor Rf and the capacitor Cf are used as the compensation circuit, the voltage phases (d, e) are approximately 80° and 90°, respectively, when the voltage gain equals '0' (b). Thus, the circuit 30 operates with increased reliability when frequency compensation is employed.

As described above, the present invention has various advantages. The preferred embodiment according to the present invention simultaneously reduces a standby current and maintains the data retention voltage using an internal circuit to constantly maintain the power supply voltage applied to the SRAM memory cell. Further, the preferred embodiment according to the present invention reduces an SRAM chip size because an additional reference voltage generating circuit block for generating the internal power supply voltage is not required. Additionally, frequency compensation is simply performed, and thus the feed-back circuit system is operated in a more stable manner to increase reliability.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A power supply for use with a memory cell, comprising:

a first transistor having a first electrode coupled to a first reference voltage a second electrode connected to a first node, and a control electrode connected to a fourth node, wherein the first node supplies an internal voltage;

a voltage divider connected between the first node and the second reference voltage, wherein the voltage divider outputs a divided voltage at a third node;

a second transistor having a first electrode connected to the second reference voltage, a second electrode connected to a second node, and a control electrode coupled to the third node;

a first resistor connected in series between the first reference voltage and the second node;

a third transistor having a first electrode connected to the first reference voltage, a second electrode connected to the fourth node, and a control electrode connected to the second node; and a second resistor and a capacitor connected in series from the second node to the fourth node.

2. The circuit of claim 1, comprising a frequency compensation circuit coupled between the second and fourth nodes.

3. The circuit of claim 1, further comprising a third resistor connected between the fourth node and a third reference voltage.

4. The circuit of claim 3, wherein the voltage divider comprises fourth and fifth resistors coupled in series between the first node and the second reference voltage, wherein the first and second resistors are coupled together at the third node, and wherein the third reference voltage equals the second reference voltage.

5. The circuit of claim 4, wherein the first, third, fourth and fifth resistors maintain a voltage at the control electrode of the first transistor less than a threshold value of the first transistor.

6. The circuit of claim 5, wherein a maximum current of approximately 1 microamp is applied to the first, third, fourth and fifth resistors.

7. The circuit of claim 1, wherein the first and third transistors are PMOS transistors, and the second transistor is a NMOS transistor, wherein the first electrode, the second electrode and the control electrode are a source electrode, a drain electrode and a gate electrode, respectively, and wherein the third reference voltage is an internal ground voltage.

8. The circuit of claim 1, wherein a standby current is decreased.

9. The circuit of claim 8, wherein a data retention voltage is increased and maintained at a substantially constant level.

10. The circuit of claim 1, wherein a data retention voltage is increased.

11. A circuit for applying power for use in a memory device, comprising:
   first and second reference voltages;
   a power supply circuit coupled between first and second reference voltages to generate a third reference voltage, wherein the power supply circuit comprises,
      a generation circuit that generates the third reference voltage, wherein generation circuit comprises a first transistor having a first electrode coupled to the first reference voltage, a second electrode connected to a first node, and a control electrode connected to a fourth node, wherein the first node supplies the third reference voltage, and
      a detection circuit that detects a change in the third reference voltage generated by the generation circuit, the detection circuit comprising,
         a voltage divider connected between the first node and the second reference voltage, wherein the voltage divider outputs a divided voltage at a third node, and
         a second transistor having a first electrode connected to the second reference voltage, a second electrode connected to a second node, and a control electrode connected to the third node,
      an adjustment circuit that maintains the third reference voltage at a substantially constant level, the adjustment circuit comprising,
         a third resistor connected in series between the first reference voltage and the second node, and
         a third transistor having a first electrode coupled to the first reference voltage, a second electrode connected to the fourth node, and a control electrode connected to the second node, and
      a frequency compensation circuit that includes a capacitor and a resistor connected in series from the second node to the fourth node; and
   a memory cell block that receives the third reference voltage from the power supply circuit.

12. The circuit of claim 11, further comprising a fourth resistor connected between the fourth node and the second reference voltage.

13. The circuit of claim 12, wherein the voltage divider comprises first and second resistors coupled in series between the first node and the second reference voltage, wherein the first and second resistors are coupled together at the third node.

14. The circuit of claim 13, wherein the first through fourth resistors maintain a voltage at the control electrode of the first transistor less than a threshold value of the first transistor, and wherein a maximum current of approximately 1 microamp is applied to the first through fourth resistors.

15. The circuit of claim 11, wherein a standby current is decreased, and wherein a data retention voltage is increased.

16. A semiconductor device, comprising:
   a memory cell;
   a memory cell driving circuit block;
   a power supply that supplies a first reference voltage;
   a circuit coupled to the memory cell and the power supply that applies a substantially constant second reference voltage to the memory cell, wherein the second reference voltage does not equal the first reference voltage, wherein the circuit comprises,
      a first transistor having a first electrode connected to the first reference voltage, a second electrode connected to a first node, and a control electrode connected to a fourth node, wherein the first node supplies the second reference voltage,
      first and second resistors connected in series from a reference node to the first node, wherein the first and second resistors are connected together at a third node,
      a second transistor having a first electrode connected to the reference node, a second electrode connected to a second node, and a control electrode connected to the third node,
      a third resistor connected in series between the first reference voltage and the second node,
      a third transistor having a first electrode coupled to the first reference voltage, a second electrode connected to the fourth node, and a control electrode connected to the second node,
      a fourth resistor connected between the fourth node and a third reference voltage, and
      a fifth resistor and a capacitor connected in series between the second node and the fourth node.

17. The semiconductor device of claim 16, wherein the memory cell further comprises:
   a sixth resistor coupled to the power supply and a fifth node;
   a seventh resistor coupled to the power supply and a sixth node;
   a fourth transistor having a first electrode coupled to a bit line, a second electrode coupled to the fifth node, and a control electrode coupled to a word line;
   a fifth transistor having a first electrode coupled to a bit bar line, a second electrode coupled to the sixth node, and a control electrode coupled to the word line;
   a sixth transistor having a first electrode commonly coupled to the second electrode of the fourth transistor and the sixth resistor at the fifth node, a second electrode coupled to a fourth reference voltage, and a control electrode coupled to the sixth node;
   a seventh transistor having a first electrode commonly coupled to the second electrode of the fifth transistor, the seventh resistor and the control electrode of the sixth transistor at the sixth node, a second electrode coupled to the fourth reference voltage, and a control electrode coupled to the fifth node.

18. The semiconductor device of claim 16, wherein a standby current is decreased, and wherein a data retention voltage is increased.

19. A power supply for use with a memory cell, comprising:
   first transistor means for supplying an internal voltage, the first transistor means having a first electrode connected to a first reference voltage, a second electrode connected to a first node, and a control electrode connected to a fourth node, wherein the first node supplies the internal voltage;

voltage divider means for dividing the internal voltage connected between the first node and the second reference voltage, wherein the voltage divider mean outputs a divided voltage at a third node;

second transistor means for adjusting a second node voltage, the second transistor means having a first electrode connected to the second reference voltage, a second electrode connected to a second node, and a control electrode connected to the third node;

first resistor means connected in series between the first reference voltage and the second node;

third transistor means for adjusting a fourth node voltage, the third transistor means having a first electrode connected to the first reference voltage, a second electrode connected to the fourth node, and a control electrode connected to the second node; and frequency compensation means for frequency compensating, wherein the frequency compensating means is second resistor means and capacitor means connected in series from the second node to the fourth node.

20. The circuit of claim 19, wherein a standby current is decreased, and wherein a data retention voltage is increased.

* * * * *